United States Patent [19]

Kong et al.

[11] Patent Number: 5,881,075
[45] Date of Patent: Mar. 9, 1999

[54] VITERBI DECODER

[75] Inventors: Jun-jin Kong, Seongnam; Yong-woo Park, Suwon, both of Rep. of Korea

[73] Assignee: Samsung Electronics Co., Ltd., Kyungki-do, Rep. of Korea

[21] Appl. No.: 814,828

[22] Filed: Mar. 11, 1997

[30] Foreign Application Priority Data

Mar. 18, 1996 [KR] Rep. of Korea ............ 1996-7208
Mar. 21, 1996 [KR] Rep. of Korea ............ 1996-7727

[51] Int. Cl.[6] .................................................. G06F 11/10
[52] U.S. Cl. ............................................................. 371/43.7
[58] Field of Search ............................. 371/43.7, 43.3, 371/43.8

[56] References Cited

U.S. PATENT DOCUMENTS

| 5,027,374 | 6/1991 | Rossman ........................ 375/94 |
| 5,408,502 | 4/1995 | How ............................. 371/43.4 |
| 5,414,738 | 5/1995 | Bienz ............................. 375/342 |
| 5,432,803 | 7/1995 | Liu et al. ...................... 371/43.7 |

FOREIGN PATENT DOCUMENTS

| 0 138 598 | 4/1985 | European Pat. Off. ........ H03M 13/12 |
| 0 441 968 | 8/1990 | European Pat. Off. ........ H03M 13/12 |
| 8-340262 | 12/1996 | Japan ........................... H03M 13/12 |

*Primary Examiner*—Hoa T. Nguyen
*Attorney, Agent, or Firm*—Sughrue, Mion, Zinn, Macpeak & Seas, PLLC

[57] ABSTRACT

A Viterbi decoder which operates a plurality of states at one time to thereby decode a plurality of channels at an increased speed. The decoder includes a branch metric calculating unit which receives convolutional data and calculates a plurality of branch metrics. A branch metric allocating unit allocates the plurality of branch metrics as even and odd branch metrics. A state metric storing unit stores a current state metric and allocates a plurality of state metrics as even and odd state metrics. First and second add-compare-select (ACS) units perform addition, comparison, and selection on the even branch and state metrics, and select paths having optimum distances. Third and fourth ACS units perform addition, comparison, and selection on the odd branch and state metrics, and select paths having optimum distances. A path tracing logic unit traces the path selection information selected in the first through fourth ACS units, and outputs decoded data. A path storing unit stores a path selection signal generated and selected in the path selection information controller.

10 Claims, 6 Drawing Sheets

FIG. 5B

VITERBI DECODER

BACKGROUND OF THE INVENTION

1. Field of the Invention

The present invention relates to a Viterbi decoder, and more particularly, to a Viterbi decoder having a plurality of add-compare-select units for adding, comparing, and selecting branch metrics and state metrics, and outputting decoded data from a selection signal representing an optimum path. The present application is based upon Korean Application Nos. 96-7208 and 96-7727, which are incorporated herein by reference.

2. Description of the Related Art

Generally, a Viterbi decoder uses a Viterbi algorithm which depends on maximum likelihood decoding when a received convolutional codeword is to be decoded. The Viterbi algorithm compares a plurality of known code sequences with received code sequences, selects a path having the shortest code distance as a maximum likelihood path, and obtains decoded data corresponding to the selected path. The Viterbi algorithm exhibits excellent error correction capability, thus is widely used in satellite, ground network, and mobile communications.

FIG. 1 is a schematic block diagram of a conventional Viterbi decoder which has a branch metric calculator 100, an add-compare-select (ACS) unit 110, a state metric memory 120, a path memory 130, and a path tracing logic unit 140. The branch metric calculator 100 calculates a Euclidean distance or a Hamming distance between received data and a codeword to be transmitted. The ACS unit 110 adds and compares the branch metrics calculated in the branch metric calculator 100 and state metrics, and selects a survival branch for each state which is the most approximate to the code order of the received data. That is, in the ACS unit 110, calculated branch metrics are added to previous state metrics in an adder according to a trellis diagram, currently received state metrics are compared in a comparator, and small state metrics are selected in a selector, wherein the selected state metrics are stored in the state metric memory 120. Selected path selection signals are stored in the path memory 130 after passing through the path tracing logic unit 140. Meanwhile, the state metric memory 120 stores a current state metric. The path tracing logic unit 140 traces path information stored in the path memory 130 in order to look for a state having the largest maximum likelihood, finds the most approximate path to that of data sent from a transmitting encoder (not shown), and outputs decoded data.

A system employing a code division multiple access (CDMA) communications method uses a Viterbi decoder including a single ACS unit. It usually uses a convolutional codeword with a constrained length K of 9, and thus the number of states is $2^{9-1}$, namely, 256. Therefore, the single ACS unit 110 performs addition, comparison, and selection on 256 states for one symbol. Since operations for a plurality of channels must be performed, decoding speed is significantly reduced.

SUMMARY OF THE INVENTION

The object of the present invention is to provide a Viterbi decoder employing a Viterbi algorithm for simultaneously processing a plurality of channels by using a plurality of add-compare-select (ACS) units for adding, comparing, and selecting branch metrics and state metrics of received data.

To achieve the above object, there is provided a Viterbi decoder for receiving convolutional data and correcting an error in the received data in which a branch metric calculating unit receives the convolutional data and calculates a plurality of branch metrics. A branch metric allocating unit allocates the plurality of branch metrics as even and odd branch metrics. A state metric storing unit stores a current state metric and allocates a plurality of state metrics as even and odd state metrics. First and second ACS units perform addition, comparison, and selection on the a even branch and state metrics, and select paths having optimum distances. Third and fourth ACS units perform addition, comparison, and selection on the odd branch and state metrics, and select paths having optimum distances. A path tracing logic unit traces the path selection information selected in the first through fourth ACS units, and outputs decoded data to find out a most approximate path to the received data path. A path storing unit stores a path selection signal generated in the path tracing logic unit.

BRIEF DESCRIPTION OF THE DRAWINGS

The above object and advantages of the present invention will become more apparent by describing in detail a preferred embodiment thereof with reference to the attached drawings in which:

FIGS. 5A and 5B are a trellis diagram for the Viterbi decoder according to the present invention.

DETAILED DESCRIPTION OF THE INVENTION

Figure 1:
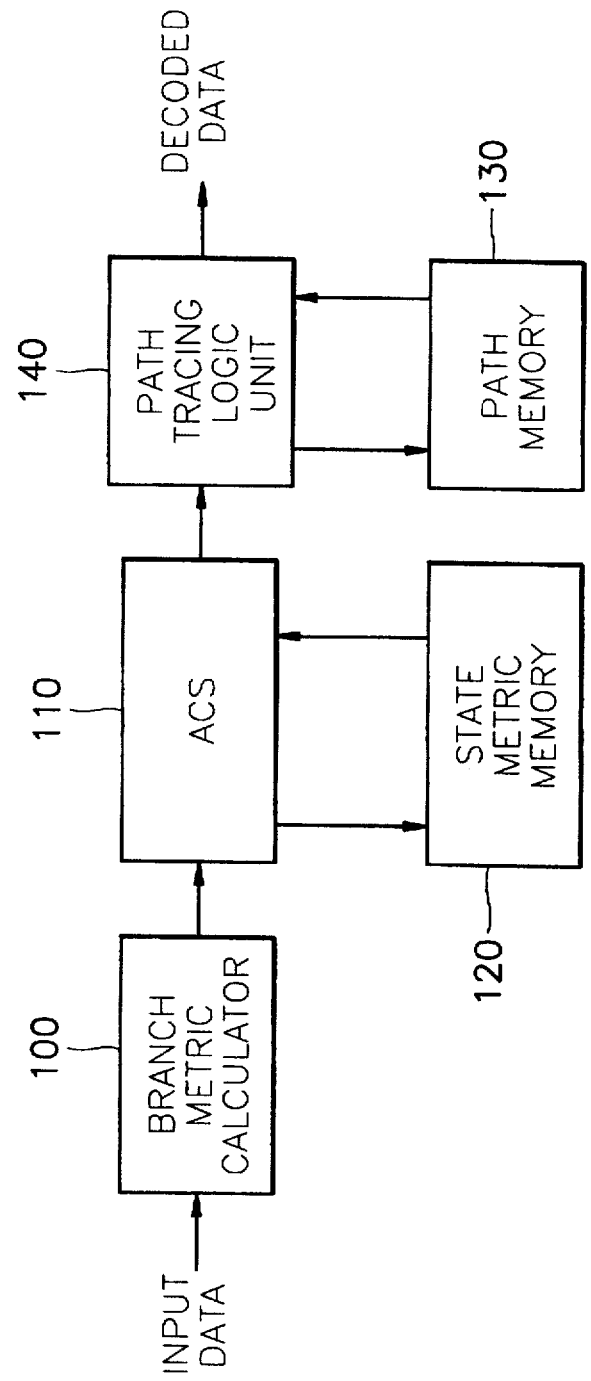
FIG. 1 is a block diagram of a conventional Viterbi decoder.
Figure 2:
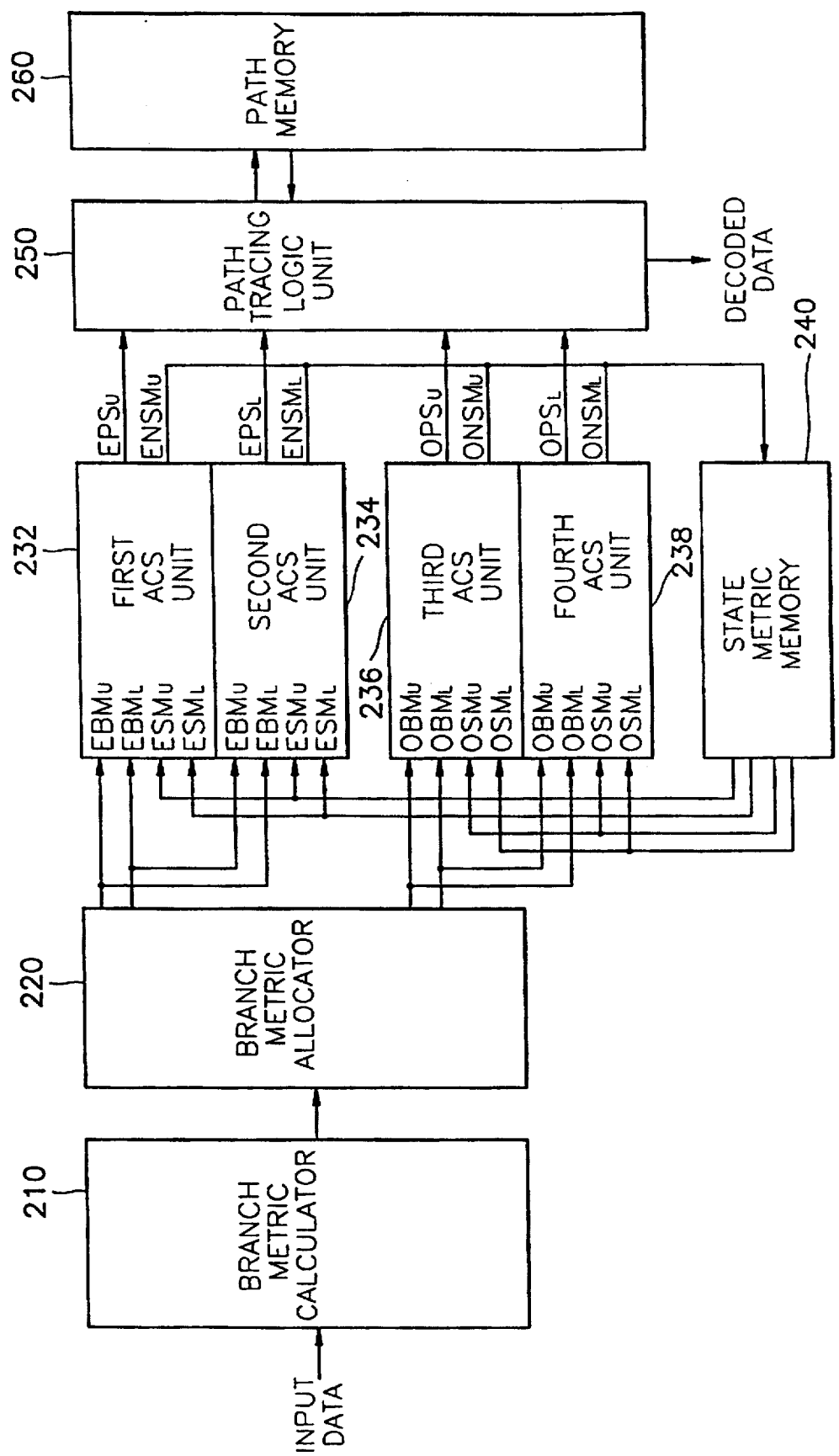
FIG. 2 illustrates an embodiment of a Viterbi decoder according to the present invention.

Referring to FIG. 2, the Viterbi decoder of the present invention has a branch metric calculator 210, a branch metric allocator 220, first through fourth ACS units 232, 234, 236, and 238, a state metric memory 240, a path tracing logic unit 250, and a path memory 260.

The branch metric calculator 210 receives a code, calculates each branch metric from the received code, and outputs eight branch metrics BM0, BM1, BM2, BM3, BM4, BM5, BM6, and BM7. The branch metric allocator 220 allocates the branch metrics output from the branch metric calculator 210 into $EBM_U$, $EBM_L$, $OBM_U$, and $OBM_L$. First through fourth ACS units 232, 234, 236, and 238 add and compare the branch metrics output from the branch metric allocator 220 and state metrics output from the state metric memory 240, select an optimum path, and output new state metrics. The state metric memory 240 stores the new state metrics and allocates four state metrics as $ESM_U$, $ESM_L$, $OSM_U$, and $OSM_L$ to the first through fourth ACS units 232, 234, 236, and 238. The path tracing logic unit 250 traces path selection information selected in the first through fourth ACS units 232, 234, 236, and 238, seeks the most approximate path of the received data, and outputs decoded data. Finally, the path memory 260 stores a path selection signal selected in the path tracing logic unit 250.

Figure 5A:
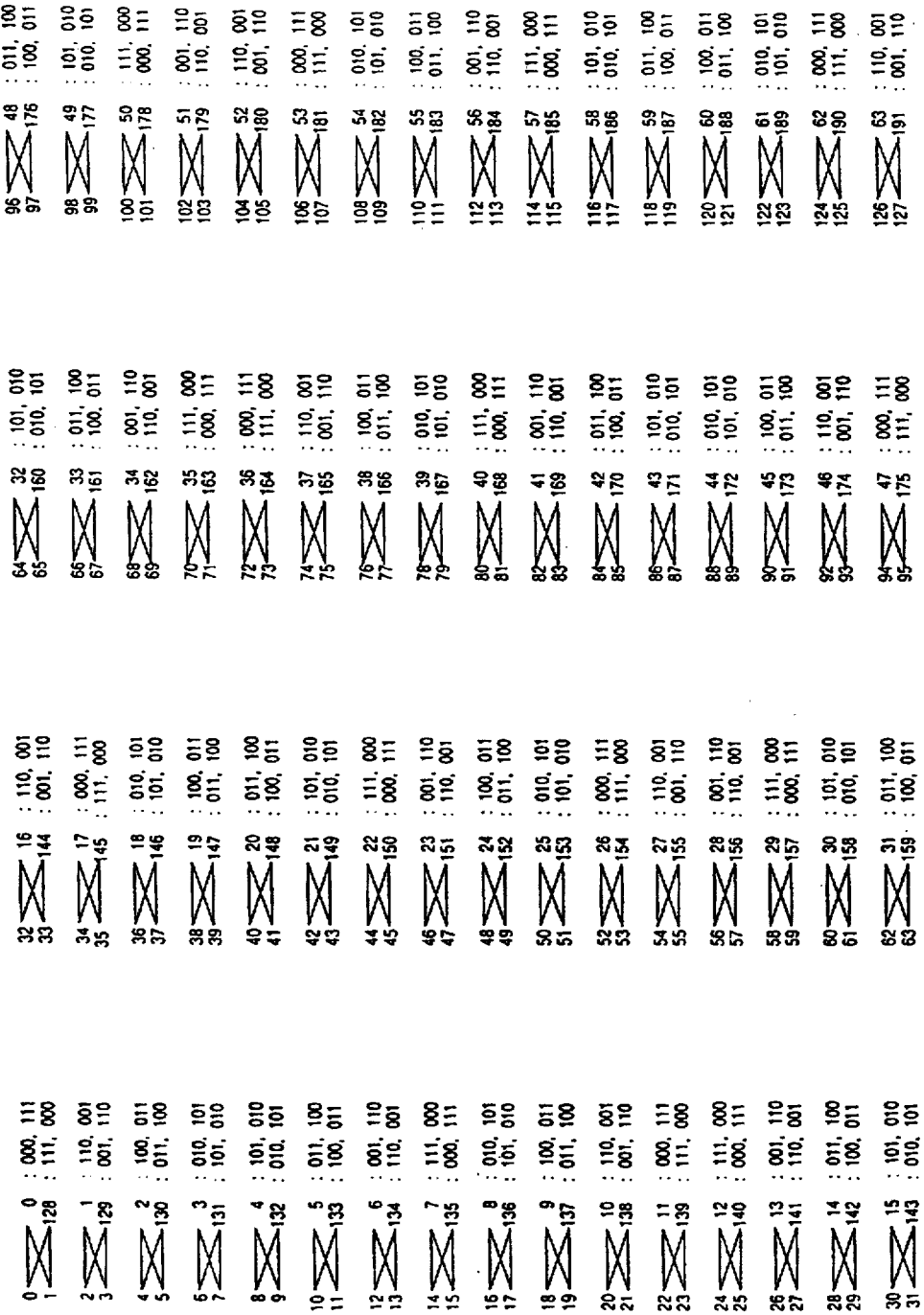
Figure 5B:
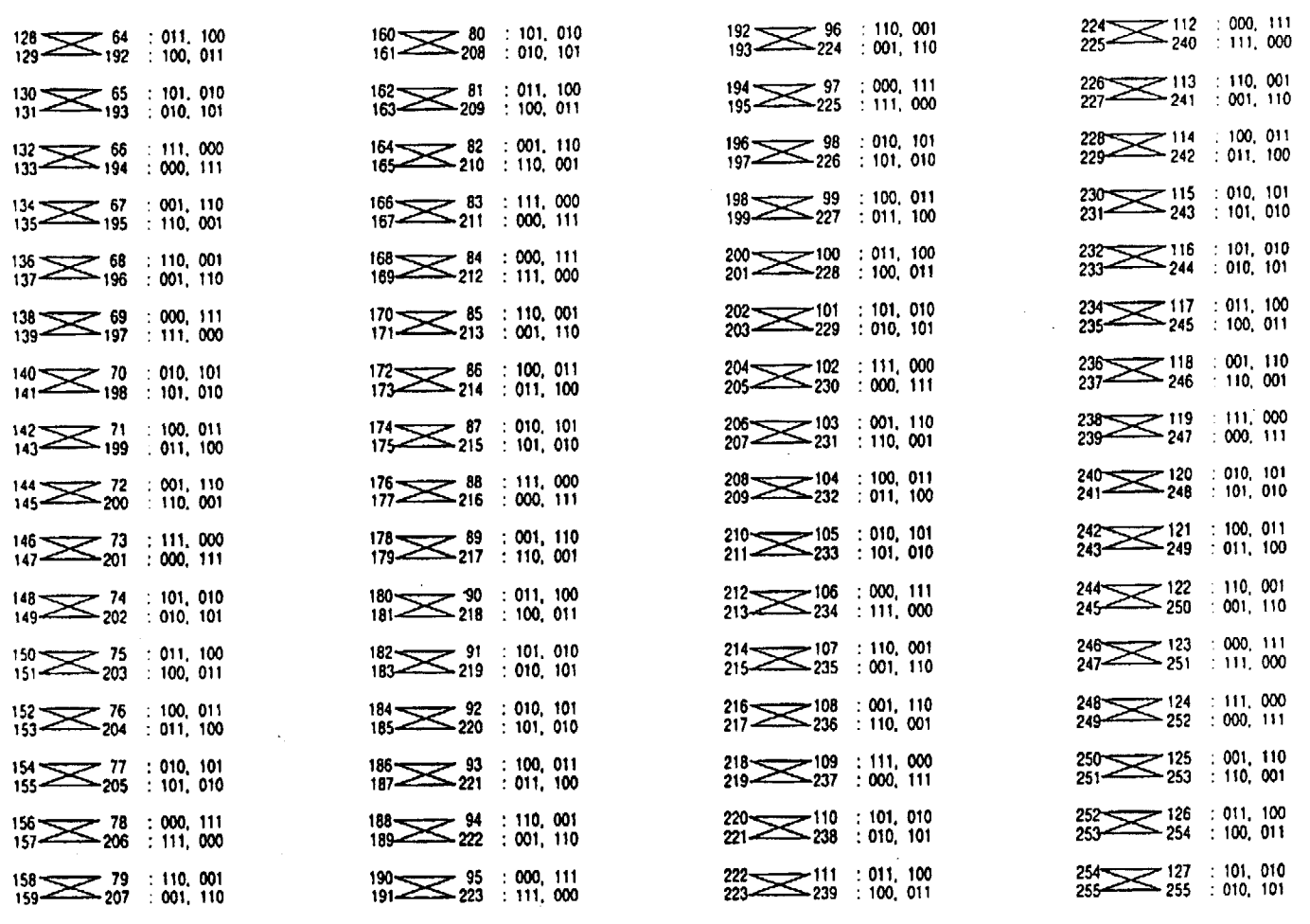

In the embodiment of the present invention, Viterbi decoding is performed at a code rate of ⅓ and a constraint length of 9. FIGS. 5A and 5B show state transitions for the Viterbi decoding. That is, FIGS. 5A and 5B show state transitions for 256 states. For example, 0 and 1 denote the number of a previous state, 0 and 128 denote the number of a current state, 000 and 111 denote an upper codeword $CW_U$, and 111 and 000 denote a lower codeword $CW_L$.

As illustrated in FIG. 2, the branch metric calculator 210 calculates a Euclidean distance or a Hamming distance between received data and a transmittable codeword. That is, the Euclidean distance between the received data and a codeword (000, 001, . . . , 111) is calculated, and BM0BM1, BM2, BM3, BM4, BM5, BM6, and BM7 are output. The branch metric allocator 220 allocates the branch metrics calculated from the received data as $EBM_U$, $EBM_L$, $OBM_U$, and $OBM_L$. Here, E and O represent even and odd numerical data, and $BM_U$ and $BM_L$ are the distances between the upper codeword $CW_U$ and the lower codeword $CW_L$ of FIGS. 5A and 5B and the received data, respectively. The four ACS units 232, 234, 236, and 238 receive the respective branch metrics allocated in the branch metric allocator 220. The state metric memory 240 stores new state metrics output from the first through fourth ACS units 232, 234, 236, and 238 and allocates four state metrics $ESM_U$, $ESM_L$, $OSM_U$, and $OSM_L$ to the first through fourth ACS units 232, 234, 236, and 238.

In the Viterbi decoder using the Viterbi algorithm, if a code rate is ⅓ (information bits/code bits) and a constraint length is 9, the number of states is $2^{9-1}$, namely, 256. Each ACS unit performs 64 (256/4) operations on a single received datum. Therefore, the first and second ACS units 232 and 234 perform operations for even states among the 256 states, whereas the third and fourth ACS units 236 and 238 perform operations for odd states among the 256 states. That is, the first ACS unit 232 receives four signals ($EBM_U$, $EBM_L$, $ESM_U$, and $ESM_L$) of branch and state metrics and performs operations for one half of even upper states 0, 2, 4, . . . , 126, and the second ACS unit 234 receives four signals ($EBM_U$, $EBM_L$, $ESM_U$, and $ESM_L$) of the branch and state metrics and performs operations for the other half of the even lower states 128, 130, 132, . . . , 254. The third ACS unit 236 receives four signals ($OBM_U$, $OBM_L$, $OSM_U$, and $OSM_L$) of the branch and state metrics and performs operations for one half of odd upper states 1, 3, 5, . . . , 127, and the fourth ACS unit 238 receives four signals ($OBM_U$, $OBM_L$, $OSM_U$, and $OSM_L$) of the branch and state metrics and performs operations for the other half of odd upper states 129, 131, 133, 135, . . . 255. Therefore, the first through fourth ACS units 232, 234, 236, and 238 receive the branch and state metrics in parallel and sequentially perform operations for states (0, 128, 1, 129), (2, 130, 3, 131), . . . , (126, 254, 127, 255) as shown in FIGS. 5A and 5B.

To sequentially perform the operations, the branch metrics and state metrics are input to the ACS units as follows. $BM_U$ of the first ACS unit 232 is equal to $BM_L$ of the second ACS unit 234, $BM_L$ of the first ACS unit 232 to $BM_U$ of the second ACS unit 234, $BM_U$ of the third ACS unit 236 to $BM_L$ of the fourth ACS unit 238, and $BM_L$ of the third ACS unit 236 to $BM_U$ of the fourth ACS unit 238 (see Table 1, below). Hence, the metrics of branches transitioned from states 0, 4, 8, 12, . . . , 240, 244, 248, 252 to states 0, 2, 4, 6, . . . , 120, 122, 124, 126 are received through the $BM_U$ terminal of the first ACS unit 232 and the $BM_L$ terminal of the second ACS unit 234. The metrics of branches transitioned from states 0, 4, 8, 12, . . . , 240, 244, 248, 252 to states 128, 130, 132, 134, . . . , 248, 250, 252, 254 are received through the $BM_L$ terminal of the first ACS unit 232 and the $BM_U$ terminal of the second ACS unit 234.

In addition, the metrics of branches transitioned from states 0, 4, 8, 12, . . . , 240, 244, 248, 252 to states 0, 2, 4, 6, . . . , 120, 122, 124, 126 are received through the $SM_U$ terminal of the first ACS unit 232. The metrics of branches transitioned from states 0, 4, 8, 12, . . . , 240, 244, 248, 252 to states 128, 130, 132, 134, . . . , 248, 250, 252, 254 are received through the $SM_L$ terminal of the second ACS unit 234.

The metrics of branches transitioned from states 2, 6, 10, 14, . . . , 242, 246, 250, 254 to states 1, 3, 5, 7, . . . , 121, 123, 125, 127 are received through the $BM_U$ terminal of the third ACS unit 236 and the $BM_L$ terminal of the fourth ACS unit 238. The metrics of branches transitioned from states 2, 6, 10, 14, . . . , 242, 246, 250, 254 to states 129, 131, 133, 135, . . . , 249, 251, 253, 255 are received through the $BM_L$ terminal of the third ACS unit 236 and the $BM_U$ terminal of the fourth ACS unit 238.

In addition, the metrics of branches transitioned from states 0, 4, 8, 12, . . . 240, 244, 248, 252 to states 0, 2, 4, 6, . . . . 120, 122, 124, 126 are received through the $SM_U$ terminal of the first ACS unit 232. The metrics of branches transitioned from states 1, 5, 9, 13, . . . 241, 245, 249, 253 to states 0, 2, 4, 6, . . . , 120, 122, 124, 126 are received through the $SM_L$ terminal of the first ACS unit 232. The metrics of branches transitioned from states 0, 4, 8, 12, . . . 240, 244, 248, 252 to states 128, 130, 132, 134, . . . , 248, 250, 252, 254 are received through the $SM_U$ terminal of the second ACS unit 234. The metrics of branches transitioned from states 1, 5, 9, 13, . . . , 241, 245, 249, 253 to states 128, 130, 132, 134, . . . , 248, 250, 252, 254 are received through the $SM_L$ terminal of the second ACS unit 234.

Signals $ENSM_U$ and $ENSM_L$ output from the first and second ACS units 232 and 234, respectively, represent new state metrics for even states, and signals $EPS_U$ and $EPS_L$ are path selection signals for the even states. Signals $ONSM_U$ and $ONSM_L$ output from the third and fourth ACS units 236 and 238, respectively, represent new state metrics for odd states, and signals $OPS_U$ and $OPS_L$ are path selection signals for the odd states.

The path selection signals output from the first through fourth ACS units 232, 234, 236, and 238 represent data decoded by the Viterbi algorithm through the path tracing logic unit 250 and the path memory 260.

Figure 3:
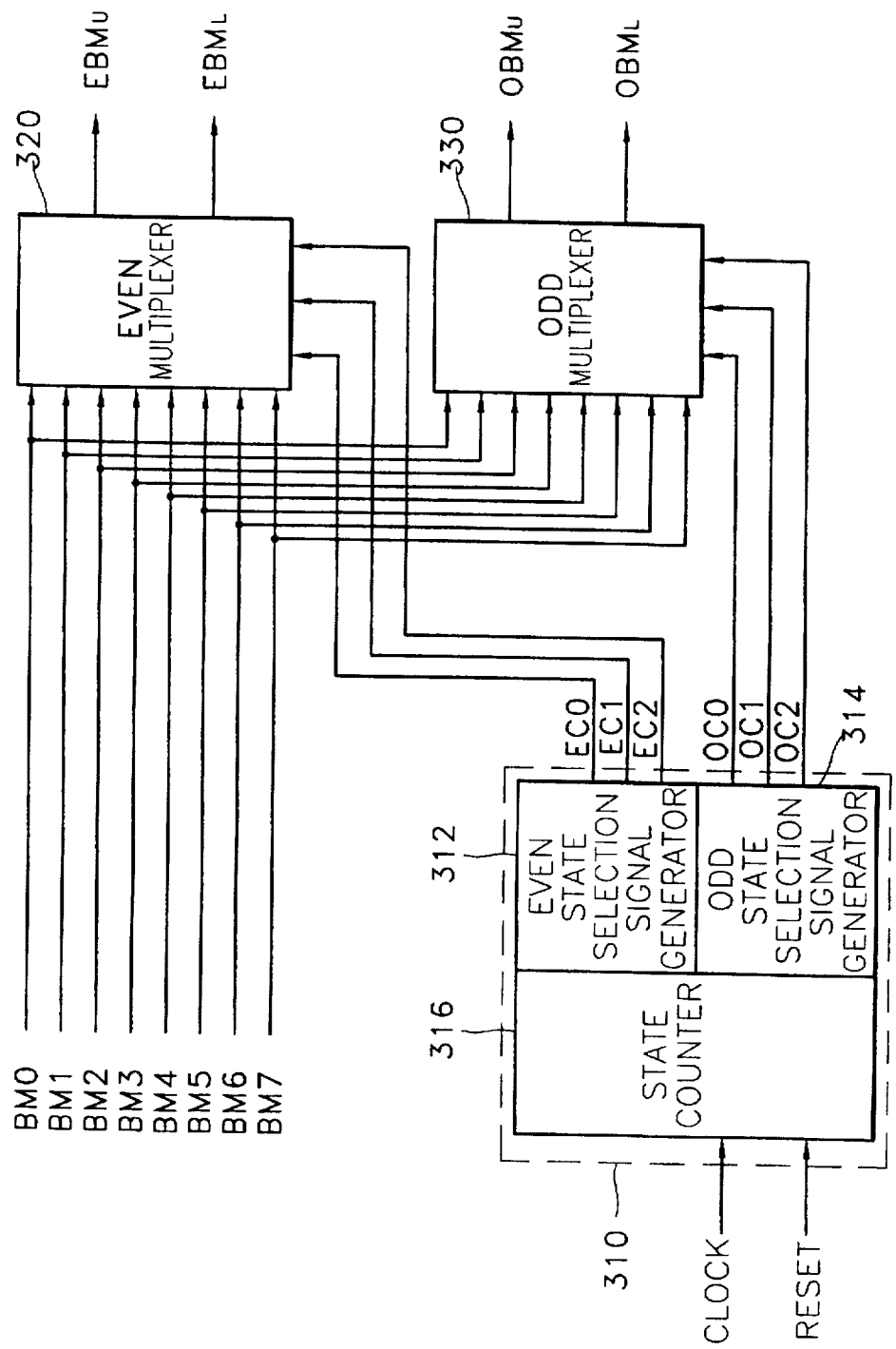
FIG. 3 is a block diagram of the branch metric allocator of FIG. 2.

FIG. 3 is a schematic diagram of the branch metric allocator 220 of FIG. 2. The branch metric allocator 220 has a controller 310, an even multiplexer 320, and an odd multiplexer 330. The controller 310 has a state counter 316, an even state selection signal generator 312, and an odd state selection signal generator 314. The controller 310 receives a clock signal and a reset signal, and outputs even state selection signals EC0, EC1, and EC2 and odd state selection signals OC0, OC1, and OC2. The even and odd multiplexers 320 and 330 select necessary signals among the branch metrics BM0, BM1, BM2, BM3, BM4, BM5, BM6, and BM7 by means of the state selection signals output from the controller 310.

As shown in Table 1, the even branch metrics $EBM_U$ and $EBM_L$ and the odd branch metrics $OBM_U$ and $OBM_L$ of FIG. 2 are selected in each pair from the branch metrics BM0, BM1, BM2, BM3, BM4, BM5, BM6, and BM7 which are output from the branch metric calculator 210 of FIG. 2 through the even and odd multiplexers 320 and 330 using the even control signals EC0, EC1, and EC2 and the odd control signals OC0, OC1, and OC2 which are output from the controller 310 of FIG. 3 as selection control signals.

The even and odd multiplexers 320 and 330 of FIG. 3 operate as outlined in Table 1. Here, selection signals C0, C1, and C2 of the multiplexers are the even selection signals EC0, EC1, and EC2, or the odd selection signals OC0, OC1, and OC2. Branch metrics $BM_U$ and $BM_L$ selected by selection signals C0, C1, and C2 are $EBM_U$, $EBM_L$ or $OBM_U$, $OBM_L$. The even control signals EC0, EC1, and EC2 and the odd control signals OC0, OC1, and OC2 to be used as selection signals of the even and odd multiplexers 320 and 330 are output from the even and odd state selection signal generators 312 and 314, respectively, of the controller 310. The even and odd state selection signal generators 312 and 314 output their respective codewords according to a generative equation of a convolutional encoder (not shown) using a value of the state counter 316.

TABLE 1

| c0 | c1 | c2 | ($BM_U$, $BM_L$) |
|---|---|---|---|
| 0 | 0 | 0 | ($BM_0$, $BM_7$) |
| 0 | 0 | 1 | ($BM_1$, $BM_6$) |
| 0 | 1 | 0 | ($BM_2$, $BM_5$) |
| 0 | 1 | 1 | ($BM_3$, $BM_4$) |
| 1 | 0 | 0 | ($BM_4$, $BM_3$) |
| 1 | 0 | 1 | ($BM_5$, $BM_2$) |
| 1 | 1 | 0 | ($BM_6$, $BM_1$) |
| 1 | 1 | 1 | ($BM_7$, $BM_0$) |

Figure 4:
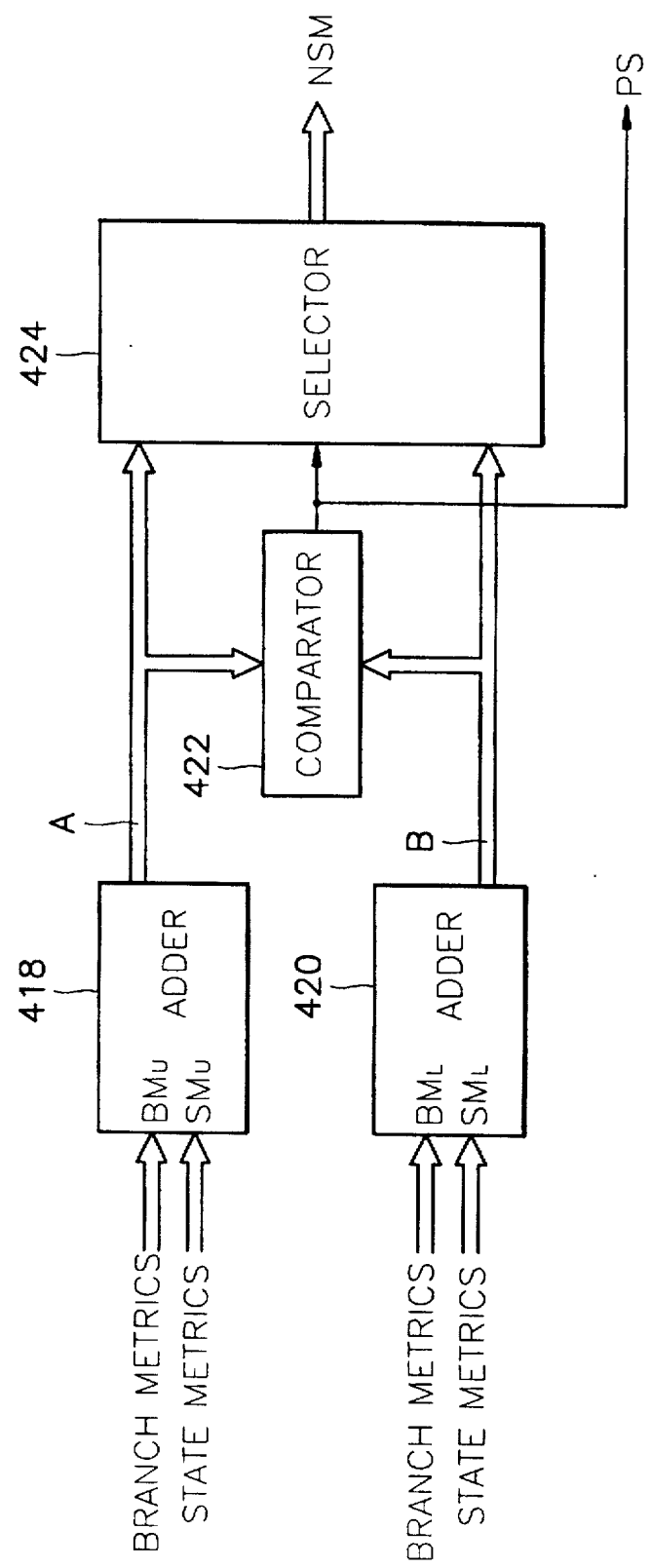
FIG. 4 is a block diagram of the add-compare-select (ACS) unit of FIG. 2.

FIG. 4 is a block diagram of an ACS unit of FIG. 2. The ACS units include a first adder 418, a second adder 420, a comparator 422, and a selector 424. The first and second adders 418 and 420 add received branch and state metrics and output data values A and B, respectively, as described with reference FIG. 2. The comparator 422 compares A with B, output 0 as a path selection signal (PS) if data A is not larger than data B, and outputs 1 as a PS if data A is larger than data B. Meanwhile, the selector 424 receives data A and B selects one of A and B according to the path selection signal of the comparator 422 and outputs the selected data as a new metric (NSM).

As described above, the ACS units in the Viterbi decoder receive branch and state metrics and operate a plurality of states at one time, thereby decoding a plurality of channels at an increased speed.

While the present invention has been described and illustrated with reference to a preferred embodiment thereof, it is to be readily understood that the present invention is not limited to the embodiment, and various changes and modifications can be made therein without departing from the spirit and scope of the invention defined in the appended claims.

What is claimed is:

1. A Viterbi decoder for receiving convolutional data and correcting an error in the received data, comprising:

a branch metric calculating unit for receiving said convolutional data and calculating a plurality of branch metrics;

a branch metric allocating unit for allocating said plurality of branch metrics as even and odd branch metrics;

a state metric storing unit for storing a current state metric and allocating a plurality of state metrics as even and odd state metrics;

first and second add-compare-select (ACS) units for performing addition, comparison, and selection on said even branch and state metrics, and selecting paths having optimum distances based on the result of said addition, comparison and selection of the first ACS units;

third and fourth ACS units for performing addition, comparison, and selection on said odd branch and state metrics, and selecting paths having optimum distances based on the result of said addition, comparison and selection of the second ACS units;

a path tracing logic unit for tracing said path selection information selected in said first through fourth ACS units to find a most approximate path to the received data, and outputting decoded data; and a path storing said outputted decoded data as unit for storing a path selection signal generated in said path tracing logic unit.

2. A Viterbi decoder as claimed in claim 1, wherein said first through fourth ACS units receive said branch and state metrics in parallel, and perform addition and comparison on said metrics.

3. A Viterbi decoder as claimed in claim 1, wherein each of said first through fourth ACS units comprises:

first and second adders for adding branch and state metrics;

a comparator for comparing the output values of said first and second adders; and a selector for receiving the outputs of said first and second adders and selecting an optimum state metric.

4. A Viterbi decoder as claimed in claim 3, wherein said selector selects said added value according to the path selection signal output by comparing values added in said first and second adders in said comparator.

5. A Viterbi decoder as claimed in claim 1, wherein said branch metric allocating unit comprises:

a controller for generating even and odd state selection signals according to a generative equation;

a first multiplexer for selecting the branch metrics for addition, comparison, and selection for even states among said plurality of branch metrics according to said even state selection signal of said controller; and a second multiplexer for selecting the branch metrics for addition, comparison, and selection for odd states among said plurality of branch metrics according to said odd state selection signal of said controller.

6. A Viterbi decoder as claimed in claim 5, wherein said controller comprises:

a state counter for calculating a state value; and a state selection signal generator for generating the even and odd state selection signals.

7. A Viterbi decoding method for receiving convolutional data and correcting an error in the received data, comprising the steps of:

receiving said convolutional data and calculating a plurality of branch metrics;

allocating said plurality of branch metrics as even and odd branch metrics;

storing a current state metric and allocating a plurality of state metrics as even and odd state metrics;

performing addition, comparison, and selection on said even branch and state metrics, and selecting paths having optimum distances based on the result of said addition, comparison and selection of the first ACS units;

performing addition, comparison, and selection on said odd branch and state metrics, and selecting paths having optimum distances based on the result of said addition, comparison and selection of the first ACS units;

tracing said path selection information selected in said first through fourth ACS units to find a most approximate path to the received data, and outputting decoded data; and storing said outputted decoded data as a generated path selection signal.

8. A Viterbi decoding method as claimed in claim 7, wherein said addition, comparison, and selection steps are performed on each of said branch metrics in parallel.

9. A Viterbi decoding method as claimed in claim 7, wherein said allocating step further comprises the steps of:

generating even and odd state selection signals according to a generative equation;

selecting the branch metrics for addition, comparison, and selection for even states among said plurality of branch metrics according to said even state selection signal; and selecting the branch metrics for addition, comparison, and selection for odd states among said plurality of branch metrics according to said odd state selection signal of said controller.

10. A Viterbi decoding method as claimed in claim 9, wherein said generating step further comprises the step of calculating a state value used to generate said even and odd state selection signals.

* * * * *